United States Patent [19]

Dassler et al.

[11] 4,066,905
[45] Jan. 3, 1978

[54] PARTICLE BEAM APPARATUS WITH ZONES OF DIFFERENT PRESSURE

[75] Inventors: Joachim Dassler; Lee H. Veneklasen; Martin Zschimmer, all of Berlin, Germany

[73] Assignee: Siemens Aktiengesellschaft, Berlin and Munich, Germany

[21] Appl. No.: 669,804

[22] Filed: Mar. 24, 1976

[30] Foreign Application Priority Data

Mar. 27, 1975 Germany .............................. 2514266

[51] Int. Cl.² ............................................. H01J 37/26
[52] U.S. Cl. ................... 250/396 R; 250/311; 250/441; 250/457
[58] Field of Search ............... 250/306, 307, 309, 310, 250/311, 396, 397, 398, 441, 457

[56] References Cited

U.S. PATENT DOCUMENTS

| | | | |
|---|---|---|---|
| 2,253,542 | 8/1941 | Von Ardenne | 250/457 |
| 2,991,362 | 7/1961 | Schumacher | 250/310 X |
| 3,363,098 | 1/1968 | Wegmann | 250/311 |
| 3,809,899 | 5/1974 | Baker et al. | 250/396 X |

*Primary Examiner*—Archie R. Borchelt
*Attorney, Agent, or Firm*—Kenyon & Kenyon, Reilly, Carr & Chapin

[57] ABSTRACT

An improved particle beam optical apparatus of the type having an evacuated housing with two sequential zones along the beam axis to be maintained at different low absolute pressures. A pressure stage detachably mounted in the housing between the zones is divided by an apertured partition into two portions communicating with the respective zones. From each portion a conduit leads through the body of the pressure stage for connection to respective vacuum pumps, the centerlines of the conduits lying in a common plane perpendicular to the beam axis. The body of the pressure stage preferably is adjustably mounted in a rigid support ring that is attached in vaccum-tight relation to the housing. The arrangement simplifies the vacuum connections, minimizes distortion of the housing and misalignment of the beam generating and control elements, and provides adjustment capability of the partition aperture.

7 Claims, 4 Drawing Figures

PARTICLE BEAM APPARATUS WITH ZONES OF DIFFERENT PRESSURE

BACKGROUND OF THE INVENTION

1. Field of the Invention

The present invention relates to particle beam optical apparatus and particularly to particle beam apparatus in which the evacuated housing is divided into two sequential zones of different pressure along the beam axis, each zone having a separate pump-out connection.

2. Description of the Prior Art

In some types of particle beam apparatus, the beam generating elements may be separated vacuum-wise from other parts of the apparatus. For example, field emission cathode beam generators can be operated only under ultrahigh vacuum (from about $10^{-9}$ to $10^{-10}$ Torr), while a high vacuum environment (from about $10^{-6}$ to $10^{-7}$ Torr) is sufficient for the other parts of the apparatus.

A specific example of a scanning electron microscope having a field emission cathode is described in a paper entitled "The Development of a Field Emission Scanning Electron Microscope" in the Proceedings of the Sixth Annual Scanning Electron Microscope IIT Research Institute, Chicago, April 1973. The equipment described in this paper has a partition that divides the beam housing transversely into an ultrahigh vacuum cathode chamber that contains the beam generating elements and a separate specimen chamber that is maintained at a higher absolute pressure. A disk valve for closing off the two chambers vacuum tight against each other is arranged so that it can be put in place from the lower pressure (i.e. the cathode chamber) side. To replace the valve requires manipulation within the cathode chamber, however, which involves the risk of contaminating this chamber.

The conduits leading from the separate vacuum subspaces or chambers of such apparatus should have as large inside diameters as possible because of the very low evacuation pressures that must be achieved. Conduits of such size, however, create mechanical instability or distortion of the beam housing, which may lead to difficulty in maintaining adjustment of the cathode in relation to the other parts of the equipment.

Furthermore, the vacuum conduits of all known dual subspace equipment of this type are spaced a considerable distance axially along the beam housing from each other, detracting from the overall appearance of the equipment. Also, the vacuum related components, such as the vacuum conduits, as well as the electron-optical elements cannot be mounted in the beam housing simultaneously. Because of space limitations the work must normally proceed sequentially and this means a long construction time.

SUMMARY OF THE INVENTION

It is a principal object of the present invention to provide a particle beam optical apparatus of the type having two vacuum zones or subspaces maintained at different absolute pressures, in which the region where the vacuum conduits for the two subspaces can cause mechanical instability is kept small.

Another object of the invention is to reduce the risk of contamination when assembling or disassembling the disk valve that seals the two subspaces vacuum tight from each other.

Another object of the invention is to reduce the manufacturing time of such equipment.

These and other objects are achieved by providing a detachable pressure stage which contains a vacuum-tight partition and two evacuation conduits, the centerlines of both conduits lying approximately in a plane normal to the axis of the beam housing. By arranging the conduits in a single transverse plane instead of spacing them axially, the height of the pressure stage can be kept quite low, and the appearance of the equipment is improved by leading both conduits out of the equipment at the same level. Since the pressure stage can be fabricated independently of the other parts of the beam housing, the manufacturing time for the apparatus can be shortened.

Although the conduits can be located diametrically opposite to each other, it is better to arrange them as close as possible so that the connecting lines to the vacuum pumps will be close together. Manufacturing requirements dictate a certain minimum spacing, however, so that a particularly preferred arrangement is to locate the centerlines of the conduits at an angle of 90°. This permits installation of the conduits in the pressure stage without manufacturing difficulties while at the same time allowing the two conduits to lead out from the rear of the beam housing, out of sight of the operator.

To avoid contamination of the cathode chamber during assembly or disassembly of a disk valve conventionally mounted on the lower pressure side of the partition, the pressure stage of the present invention has a disk valve mounted on the side of the partition that faces the subspace of higher pressure.

In a particularly preferred embodiment, the pressure stage is equipped with a fluorescent screen having a central opening and mounted symmetrically with the beam axis to facilitate adjustment of the pressure stage with respect to the particle beam. A conventional choke diaphragm of the kind normally provided between differential vacuum zones in this type of equipment may be positioned on the higher pressure side of the fluorescent screen. This arrangement permits manipulation of the choke diaphragm without adverse effects in the lower pressure zone.

A further refinement of the present invention is the provision of a mirror system to permit observation of the fluorescent screen from outside the beam housing, thereby simplifying adjustment of the pressure stage. In this regard, an arrangement that makes pressure stage manipulation particularly easy is to support the pressure stage by means of adjustment screws in a support ring that is rigidly mounted in the beam housing.

These and other features of the invention are illustrated in the accompanying drawings of a preferred embodiment described below.

DESCRIPTION OF THE PREFERRED EMBODIMENT

Figure 1:
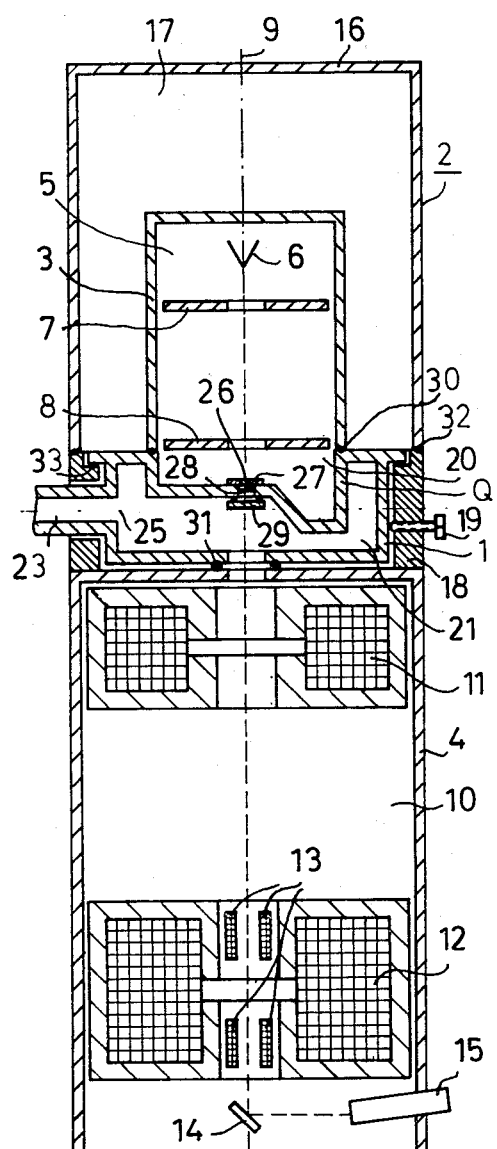
FIG. 1 is a schematic representation of a scanning electron microscope having a pressure stage according to the invention.

In FIG. 1, a pressure stage having a relatively short cylindrical body 1 is arranged in a scanning electron microscope 2 between an upper housing 3 and a lower housing 4. The upper housing encloses a cathode space 5 that contains a field emission cathode 6, a first anode 7, and a second anode 8 for generating an electron beam directed downwards along a central axis 9. The lower housing encloses an object space 10 that contains an electromagnetic condenser lens 11, an objective lens 12 having deflection coils 13, an object 14 to be examined, and a radiation detecting device 15. The upper housing 3 is surrounded by an outer housing 16, enclosing a space 17 between the housings that is filled with an insulating medium such as sulfur hexafluoride ($SF_6$).

The body 1 of the pressure stage, which is shown in greatly simplified form in FIG. 1, is positioned within a support ring 18 by adjustment means such as angularly spaced screws 19 (only one shown) to permit limited adjustment of the pressure stage in a horizontal plane so that its center can be aligned precisely with the beam axis.

Figure 2:
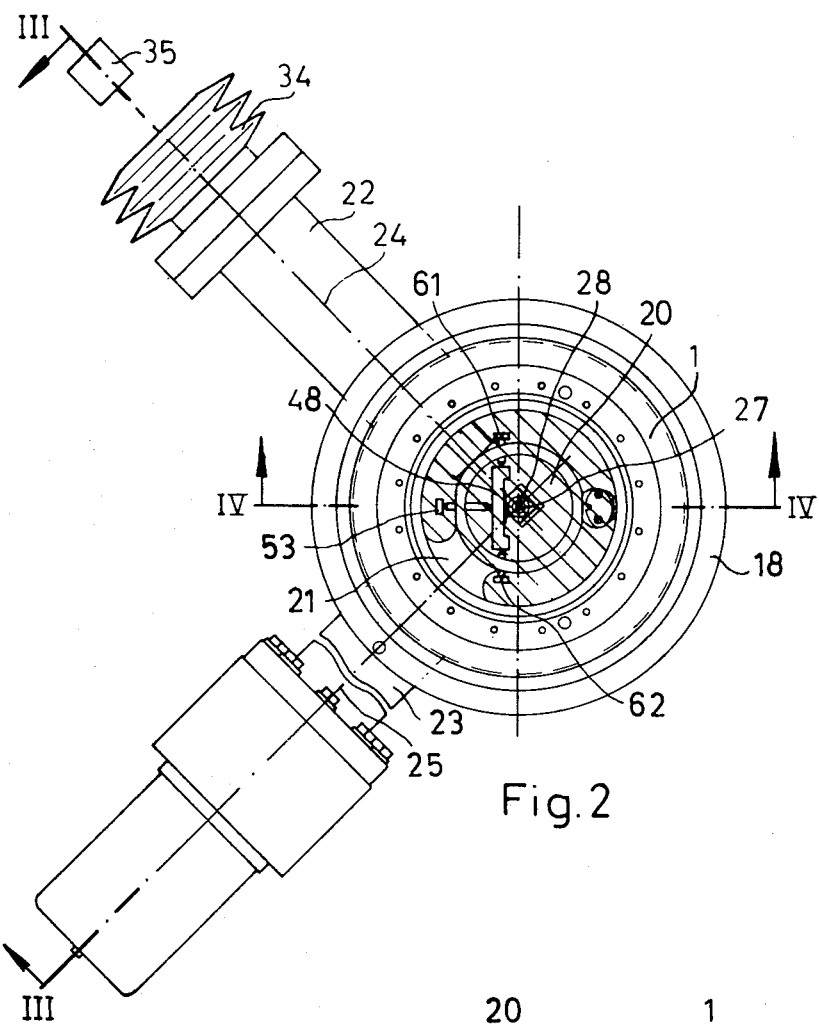
FIG. 2 is a top view of a preferred pressure stage arrangement.

A transverse integral partition Q divides the interior of body 1 into a first portion 20 that communicates with cathode space 5 and a second portion 21 that communicates with object space 10. First portion 20 is provided with a vacuum conduit 22 (see FIG. 3), and second portion 21 is provided with a separate vacuum conduit 23. The partition Q is angularly offset along the beam axis, thereby permitting respective centerlines 24 and 25 of these vacuum conduits to lie approximately in a common plane normal to the electron beam axis 9, with the centerlines preferably extending at right angles to one another, as shown in FIG. 2.

A central aperture 26 in partition Q provides a passageway for the electron beam for the cathode space to the object space when it is desired to expose the object for examination. In order to have a visual indication that the pressure stage is properly aligned with respect to the beam axis a fluorescent screen 27 surrounds aperture 26 on the cathode space side of the partition. A mirror system, to be described in connection with FIG. 4, reflects the image of the fluorescent screen through a viewing port in the body of the pressure stage to the outside.

On the side facing away from the cathode space, the fluorescent screen carries a choke diaphragm 28, which separates portion 20 from 21 and thereby the cathode space from the object space. This choke diaphragm is in the form of a thin disk with a central hole approximately 0.1 mm in diameter. In order to seal this small opening to maintain different evacuation pressures in the cathode and object spaces, a disk valve 29 is mounted in the second portion of the pressure stage that communicates with the object space. The operating mechanism for this valve will be described in connection with FIG. 3.

Since the body of the pressure stage and its support ring are preferably detachably mounted in the housing of the electron microscope, the interfaces between the pressure stage components and the various housing enclosures are provided with suitable seals. In particular, an ultrahigh vacuum seal 30 connects the body of the pressure stage to upper housing 3, while a high vacuum seal 31 connects the body with the lower housing 4. In addition, a seal 32 detachably connects the support ring to outer housing 16, and a seal 33 similarly connects the support ring to the body of the pressure stage, the latter two seals thereby closing off insulating space 17 from the outside to prevent escape of the insulating medium.

Figure 3:
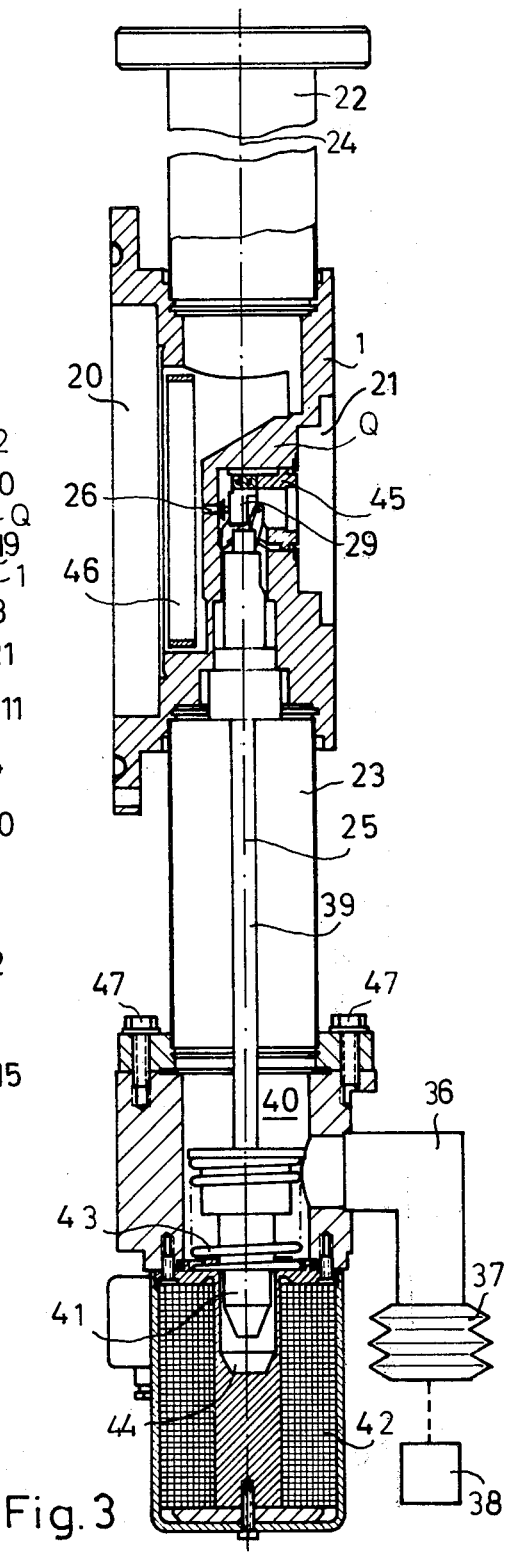
FIG. 3 is a side view in cross section of the pressure stage of FIG. 2 taken in the direction of arrows III—III.
Figure 4:
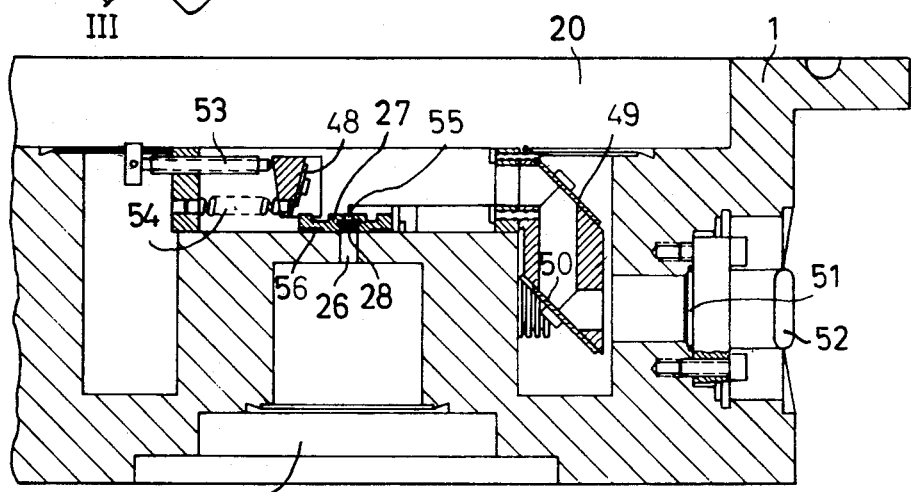
FIG. 4 is a partial side view in cross section of the pressure stage of FIG. 2 taken in the direction of arrows IV—IV.

FIGS. 2 through 4 provide more detailed views of a preferred embodiment of the pressure stage with its associated vacuum fittings and a viewing arrangement for monitoring adjustment of the pressure stage relative to the beam axis. FIG. 2 shows a top view of the pressure stage, parts having the same function as in the schematic view of FIG. 1 being labelled with the same reference symbols. To more clearly present the partition arrangement, the part of the pressure stage that corresponds to the first portion 20 is emphasized by shading, while portion 21 is unshaded.

Radially extending vacuum conduits 22 and 23 are connected to portions 20 and 21, respectively, and their respective centerlines 24 and 25 lie approximately in the same horizontal plane and in perpendicular vertical planes. Since the operator's position is to the right of the pressure stage, as viewed in FIG. 2, it is apparent that this arrangement of the vacuum conduits places them unobtrusively toward the rear of the apparatus, where they do not interfere either physically or visually with operation of the equipment.

Conduit 22 is connected through a spring bellows 34 with an ion pump 35, and conduit 23 is similarly connected (see FIG. 3) through an elbow fitting 36 and spring bellows 37 to separate ion pump 38. Thus, ion pump 35 serves to evacuate the cathode space, and pump 38 evacuates the object space. As mentioned previously, the pressure in the cathode space is reduced to the range of $10^{-9}$ to $10^{-10}$ Torr (ultra-high vacuum), while a vacuum of $10^{-6}$ to $10^{-7}$ Torr (high vacuum) prevails in the object space.

Spring bellows 34 and 37 allow displacement of the pressure stage relative to the ion pumps for adjustment purposes and also isolate the pressure stage from mechanical vibrations of the pumps.

Referring particularly to FIG. 3, conduit 23, that is connected to the second portion of the pressure stage that communicates with the higher pressure object space, contains an actuating rod 39 that connects disk valve 29 to a drive mechanism designated generally by 40. This drive mechanism includes an iron core 41 mounted on the outer end of the actuating rod and forming an armature for a magnet coil 42.

In the normal condition, no current flows through the magnet coil, and a compression spring 43 urges the actuating rod radially inward to place disk valve 29 into the illustrated position where it seals the first portion 20 vacuum tight from the second portion 21, and thus the cathode space from the object space.

When it is desired to expose object specimen 14 to the electron beam, the magnet coil is energized, thereby pulling the iron core outward against the action of spring 43 until it strikes a stop 44. This movement, transmitted through actuating rod 39, withdraws disk valve 29 out of the area of the beam axis, allowing the electron beam to pass unimpeded through the central openings in the fluorescent screen, partition, and choke diaphragm to strike the specimen at the bottom of the object space. To protect the beam from stray fields in the vicinity of the pressure stage, shielding rings 45 and 46 are provided on the high vacuum and ultra-high vacuum sides, respectively, of the partition Q, the shields preferably being made of mu metel.

As mentioned earlier, the arrangement of the disk valve and its operating mechanism on the higher pressure object space side of the pressure stage partition permits assembly and disassembly of the valve without risk of contaminating the cathode space. Installation and replacement of the valve assembly can be performed in a particularly simple way because the drive mechanism, actuating rod, and disk valve form a single unit that is detachably mounted on the flanged end of conduit 23 by mounting bolts 47.

FIG. 4 shows a cross section along line IV—IV in FIG. 2. In this view the previously mentioned fluorescent screen 27 and choke diaphragm 28 appear in more detail, along with the arrangement for observing the fluorescent screen from the operator's position in front of the apparatus. This arrangement comprises a mirror system that includes one adjustable mirror 48 and two fixed mirrors 49 and 50, the latter mirror transmitting the image of fluorescent screen 27 through an objective lens 51 and a window 52 in the front of the pressure stage body. Another window (now shown) in the front of the support ring and aligned with the viewing axis allows the operator to see the screen from outside the equipment housing.

The adjustable mirror 48 of the system is supported by two pivot screws 61, 62 (see FIG. 2) so that it can be tilted about an axis that is tangent to a circle concentric with the beam axis by an adjusting arrangement such as a thumb screw 53 and a compression spring 54. The compression spring contacts the back of the mirror below the tilt axis and urges it against the tip of the thumb screw, which contacts the back of the mirror above the tilt axis. After the mirror has been adjusted to provide an image at the window 52 that is centered on central opening 55 of the fluorescent screen, the pressure stage can be installed in the microscope housing, and the compression spring will hold the mirror in adjustment against any vibration.

It should be mentioned that the design of the fluorescent screen shown in FIG. 4 protects against charging up choke diaphragm 28 by recessing the diaphragm relative to surface 56 of the fluorescent screen. In addition, it should be mentioned that the fluorescent screen can also be adjustably mounted on the partition, and the pressure stage can also carry the drives for adjusting the cathode elements, if desired. In this way, the detachably mounted pressure stage of the invention can be separately assembled and the relation between the various elements of the apparatus adjusted outside the confines of the particle beam housing.

Although use of a pressure stage according to the invention is particularly of interest with a scanning electron microscope having a field emission cathode, the invention is also applicable to other types of particle beam optical apparatus. For example, in a stationary image transmission electron microscope, the pressure stage can be installed immediately ahead of the object space. Further applications of the invention may be possible, for example, in an ion microscope or a particle-beam spectrometer.

We claim:

1. A particle beam optical apparatus of the type having means for directing a beam of charged particles along an axis, a housing surrounding the particle beam along the axis, and means located at an intermediate position along the beam axis for dividing the housing into two subspaces following sequentially along the beam axis, one of the subspaces being adapted to be evacuated to a first low pressure, and the other being adapted to be evacuated to a second low pressure higher than the first low pressure, wherein the means for dividing the housing into two subspaces comprises:
   a pressure stage having a body that is detachably mounted in vacuum-tight relation to the housing at said intermediate position, the pressure stage including
      a vacuum-tight partition dividing said body into a first portion communicating with the one subspace and a second portion communicating with the other subspace,
      a first conduit leading from said first portion through the body and adapted for connection to a means for evacuating the one subspace to said first low pressure, and
      a second conduit leading from said second portion through the body and adapted for connection to a means for evacuating the other subspace to said second low pressure,
   the centerlines of said first and second conduits lying approximately in a common plane perpendicular to the beam axis.

2. Particle beam optical apparatus according to claim 1 wherein the centerlines of the first and second conduits form an angle of approximately 90°.

3. Particle beam optical apparatus according to claim 1 wherein the partition of the pressure stage has an opening concentric with the beam axis, and the pressure stage further comprises:
   a disk valve mounted in said second portion for selectively closing said opening to seal the two subspaces vacuum-tight against each other.

4. Particle beam optical apparatus according to claim 1 wherein the pressure stage further comprises a fluorescent screen having a central opening and mounted on the partition with the central opening of the screen coaxial with the beam axis.

5. Particle beam optical apparatus according to claim 4 wherein the pressure stage further comprises a choke diaphragm mounted on the partition on the side of the fluorescent screen that faces the other subspace.

6. Particle beam optical apparatus according to claim 4 wherein the pressure stage further comprises a mirror system to permit observation of the fluorescent screen from outside the body of the pressure stage.

7. Particle beam optical apparatus according to claim 1 comprising:
   a support ring attached rigidly to the housing at said intermediate position and
   means for adjustably mounting the body of the pressure stage in the support ring.

* * * * *